United States Patent
Wei et al.

(10) Patent No.: US 8,248,808 B2
(45) Date of Patent: Aug. 21, 2012

(54) PORTABLE ELECTRONIC DEVICE WITH CLIP MECHANISM

(75) Inventors: Xiao-Liang Wei, Shenzhen (CN); Zhi-Yun Shen, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 249 days.

(21) Appl. No.: 12/771,208

(22) Filed: Apr. 30, 2010

(65) Prior Publication Data

US 2011/0044013 A1    Feb. 24, 2011

(30) Foreign Application Priority Data

Aug. 19, 2009    (CN) .......................... 2009 1 0305808

(51) Int. Cl.
*H05K 5/00* (2006.01)

(52) U.S. Cl. ........ 361/749; 361/694; 361/769; 361/801; 361/802; 361/814; 455/575.1; 455/575.2; 455/575.3; 455/575.4; 174/521

(58) Field of Classification Search .......... 361/801–802, 361/814; 455/575.1–575.4
See application file for complete search history.

(56) References Cited

U.S. PATENT DOCUMENTS

| | | | |
|---|---|---|---|
| 7,532,487 B2 * | 5/2009 | Lai et al. ........................ | 361/816 |
| 7,589,977 B2 * | 9/2009 | Lin ................................ | 361/816 |
| 2009/0209118 A1 * | 8/2009 | Wahlberg et al. .............. | 439/77 |
| 2010/0061055 A1 * | 3/2010 | Dabov et al. ............. | 361/679.56 |

* cited by examiner

*Primary Examiner* — Tuan T Dinh
*Assistant Examiner* — Mukund G Patel
(74) *Attorney, Agent, or Firm* — Altis Law Group, Inc.

(57) ABSTRACT

A portable electronic device includes a housing, a printed circuit board, a flexible printed circuit board, and a clip. The printed circuit board is attached to one side of the housing. The flexible printed circuit board is attached to another side of the housing. The clip is attached to the housing. The clip includes at least one arcuate portion, and the arcuate portion elastically presses the flexible printed circuit board to the printed circuit board.

7 Claims, 10 Drawing Sheets

PORTABLE ELECTRONIC DEVICE WITH CLIP MECHANISM

BACKGROUND

1. Technical Field

The present disclosure generally relates to portable electronic devices and, particularly, to a portable electronic device having a clip mechanism.

2. Description of Related Art

Generally, many portable electronic devices include a liquid crystal display (LCD), a keypad, and so on. In order to electronically connect the LCD and the keypad to a printed circuit board (PCB), several flexible printed circuit boards (FPCBs) need to be positioned among them to electrically connect the LCD and the keypad to the PCB. However, the FPCBs need to be bent at several places, and contact with the PCB can easily work loose resulting in an unstable connection.

Therefore, there is room for improvement within the art.

BRIEF DESCRIPTION OF THE DRAWINGS

Many aspects of the portable electronic device with a clip mechanism can be better understood with reference to the following drawings. The components in the drawings are not necessarily drawn to scale, the emphasis instead being placed upon clearly illustrating the principles of the portable electronic device with the clip mechanism. Moreover, in the drawings, like reference numerals designate corresponding parts throughout the several views, in which.

DETAILED DESCRIPTION

Figure 1:
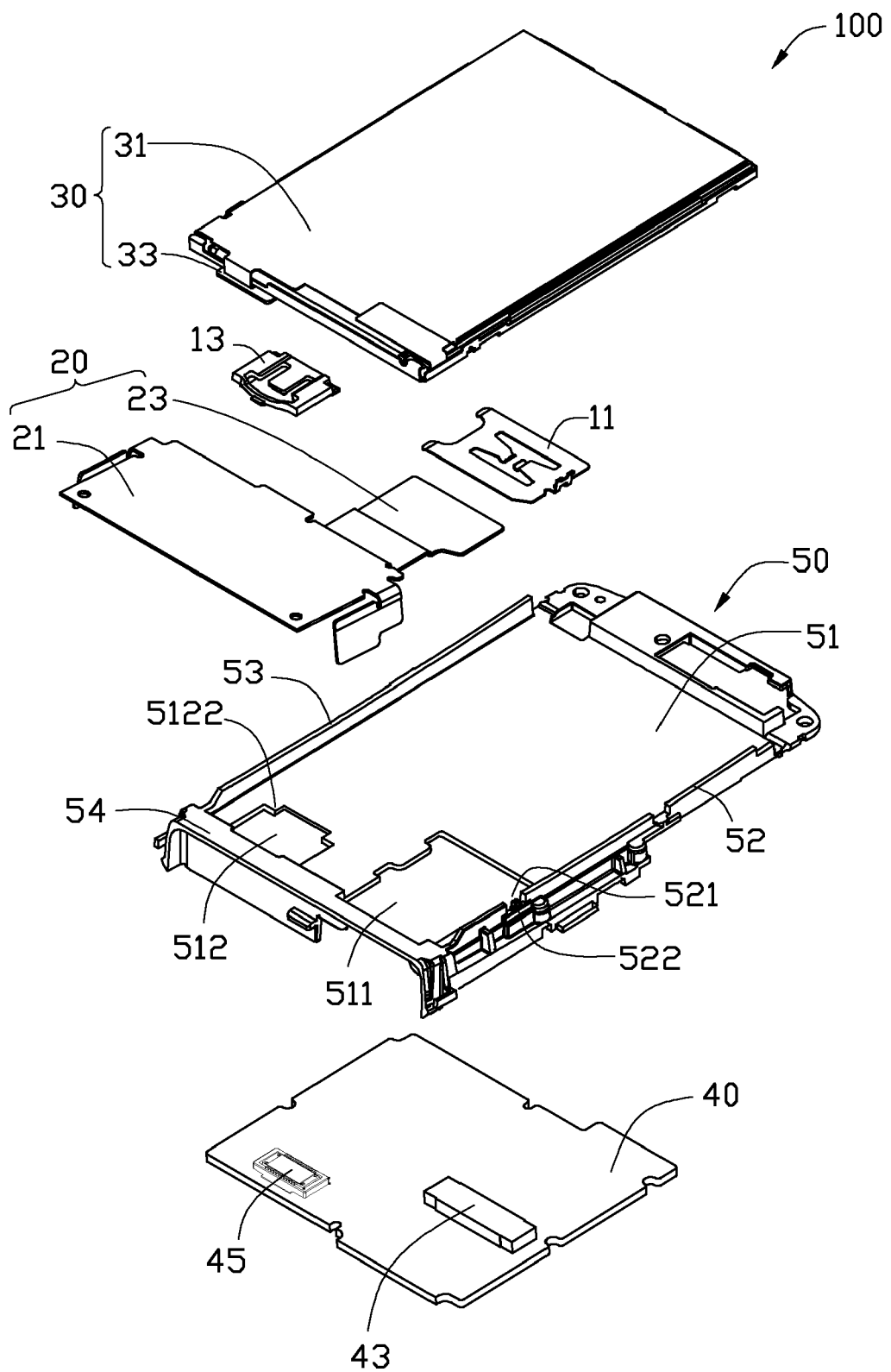
FIG. 1 is an exploded, isometric view of a portable electronic device with a clip mechanism in accordance with an exemplary embodiment.
Figure 2:
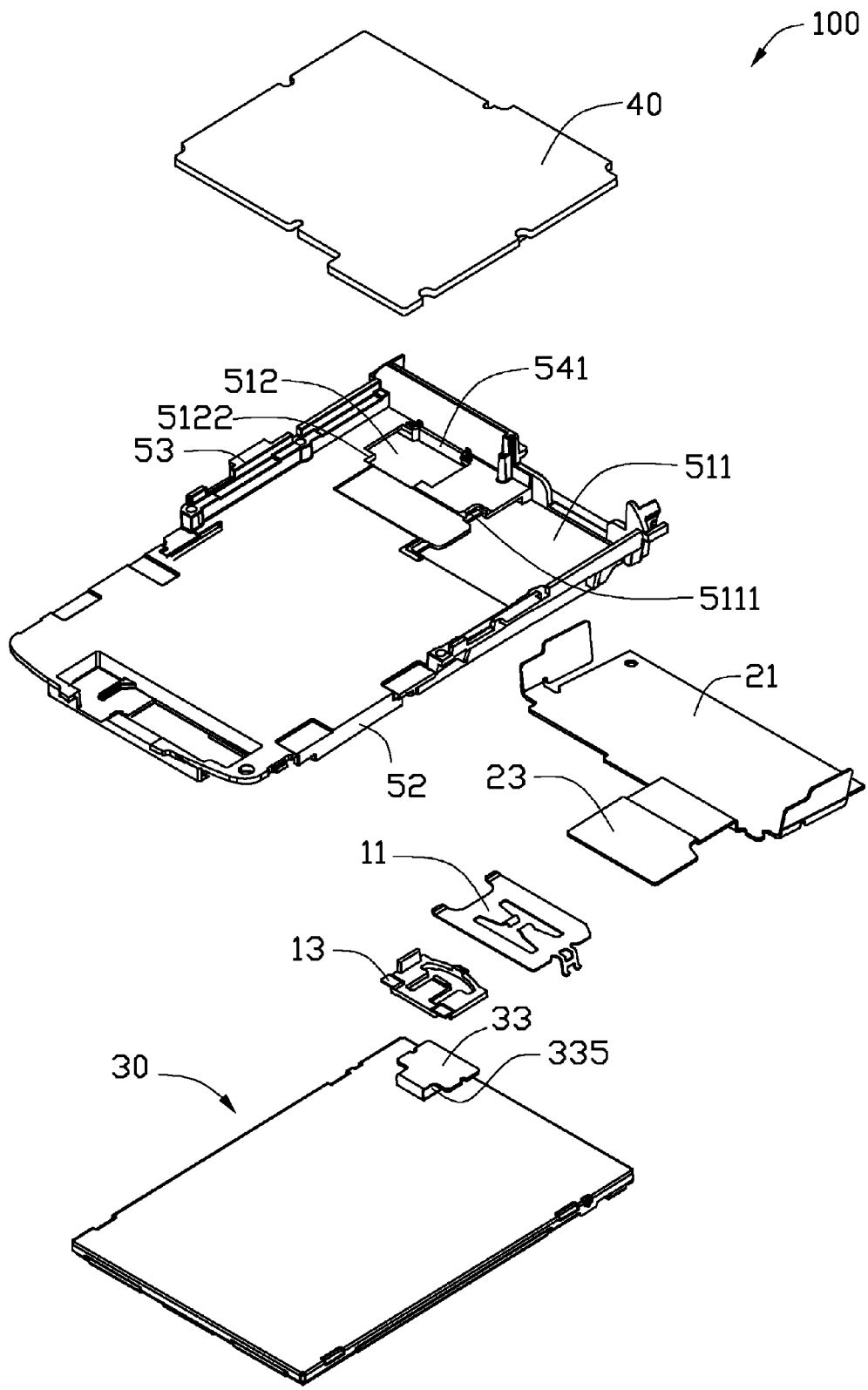
FIG. 2 is similar to FIG. 1, but shown from another aspect.

FIGS. 1 and 2 show a portable electronic device 100, such as a mobile phone, employing a clip mechanism. The mobile phone 100 is an exemplary application, for the purposes of describing details of an exemplary embodiment of the clip mechanism. The mobile phone 100 includes a first clip 11, a second clip 13, a first FPCB 20, an LCD module 30, a PCB 40, and a housing 50. The first clip 11 and the second clip 13 are mounted to the housing 50. The LCD module 30 is positioned at one side of the housing 50, and the PCB 40 is positioned at an opposite side of the housing 50. The first clip 11 is configured to stably secure the FPCB 20 to the PCB 40. The second clip 13 is configured to stably secure the LCD module 30 to the PCB 40.

Figure 3:
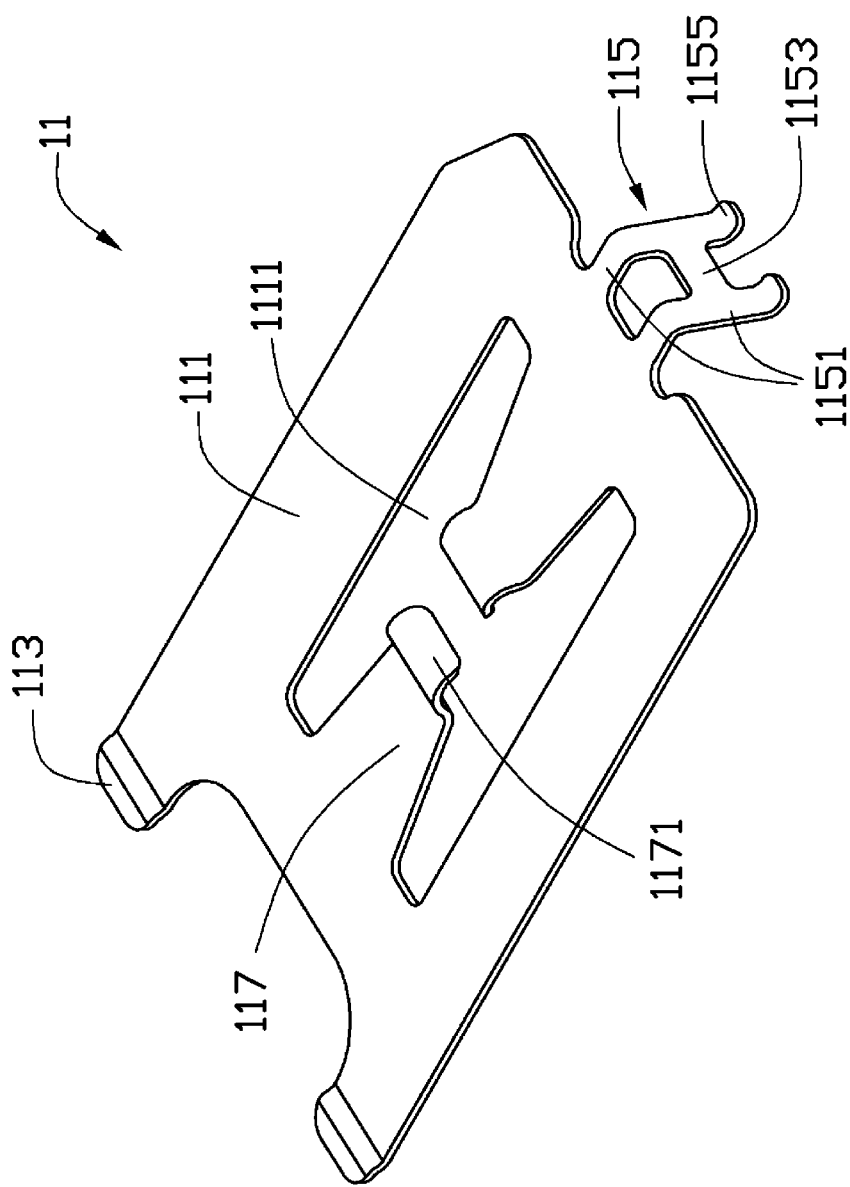
FIG. 3 is an enlarged view of a first clip in FIG. 1.

Referring to FIG. 3, the first clip 11 is made of metal, and may be stamped or punched from a metal sheet. The first clip 11 includes a main section 111. Two tabs 113 extend from one end of the main section 111. A latching portion 115 extends from a middle area at another end of the main section 111. The latching portion 115 includes two legs 1151 parallel to each other. A beam 1153 is connected between the legs 1151. A foot 1155 is formed at each end of the legs 1151. The main section 111 defines an opening 1111, and forms two opposite tongue portions 117 extending into the opening 1111. An arcuate portion 1171 is formed at a distal end of each tongue portion 117.

Figure 4:
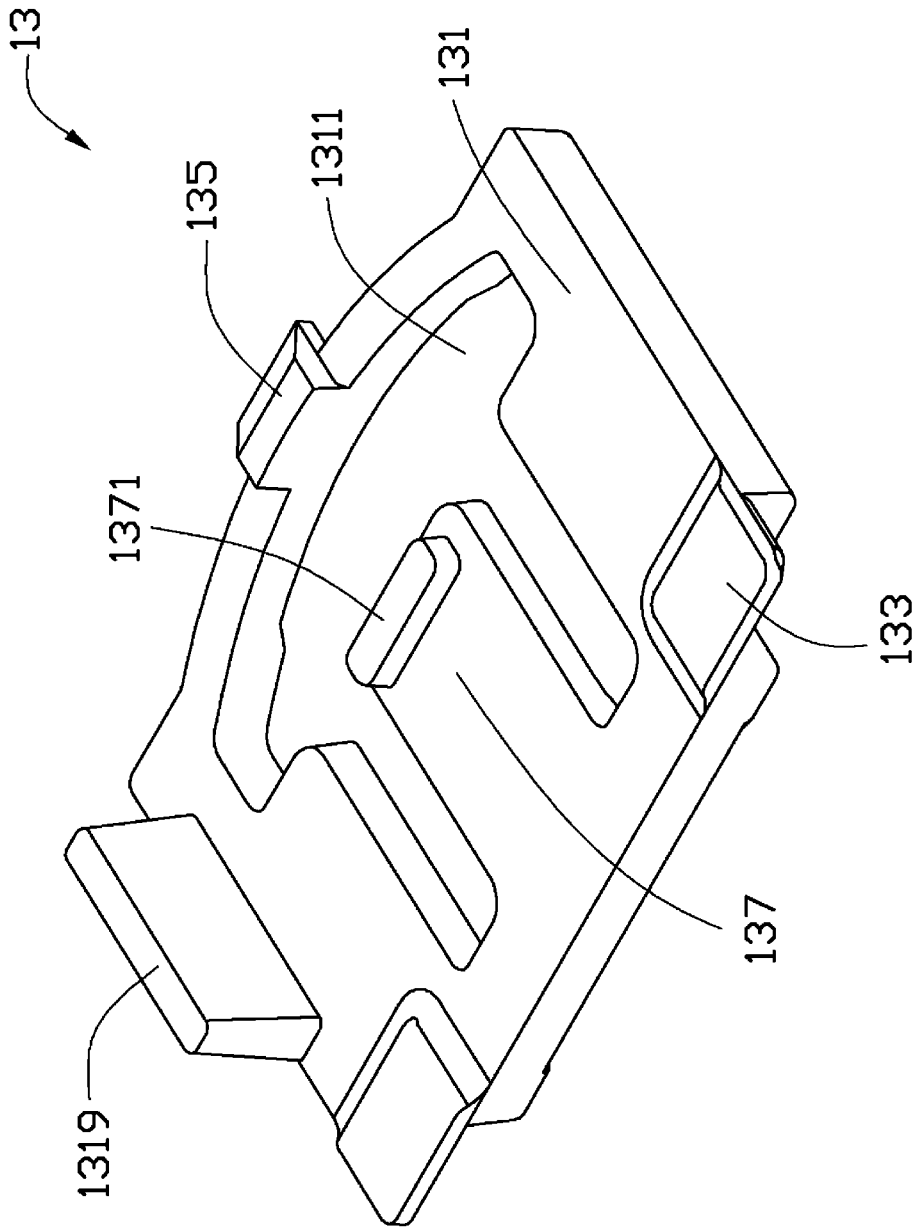
FIG. 4 is an enlarged view of a second clip in FIG. 1.
Figure 5:
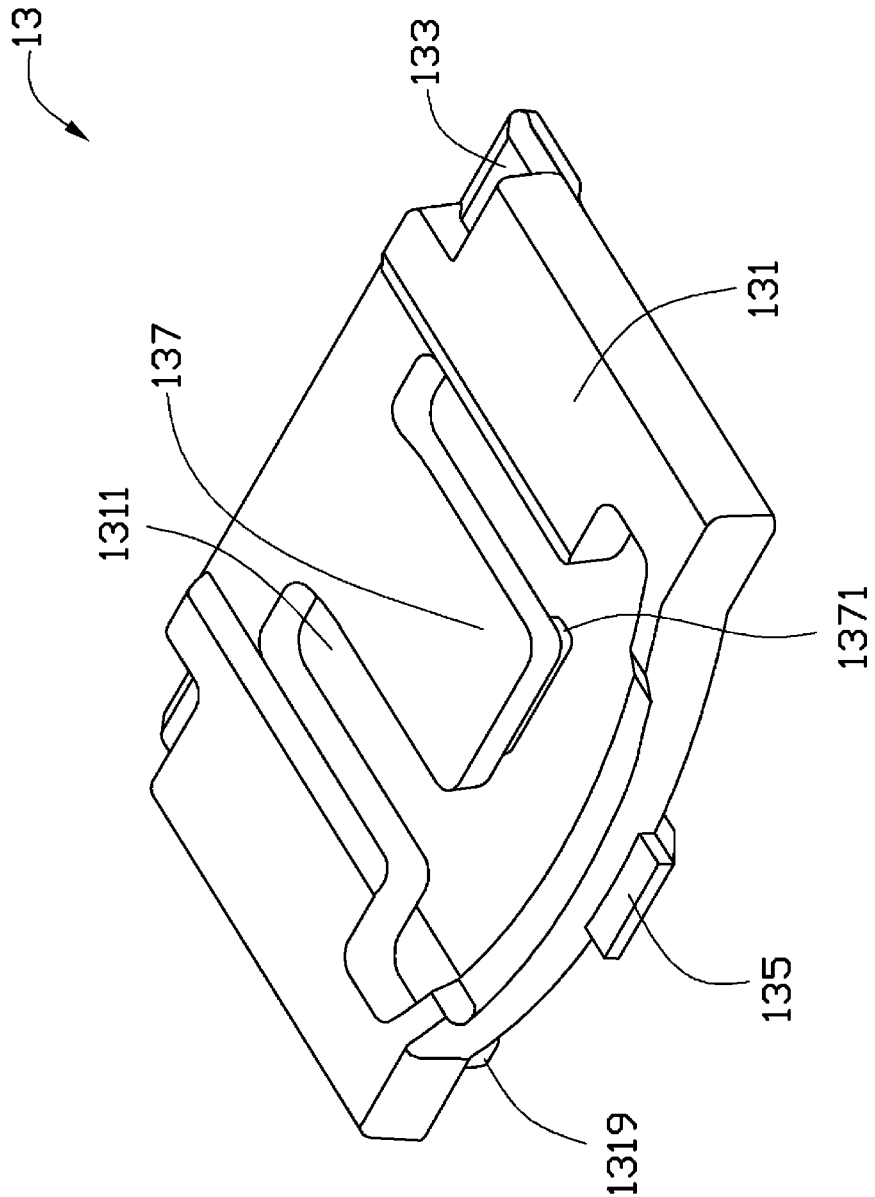
FIG. 5 is similar to FIG. 4, but shown from another aspect.
Figure 6:
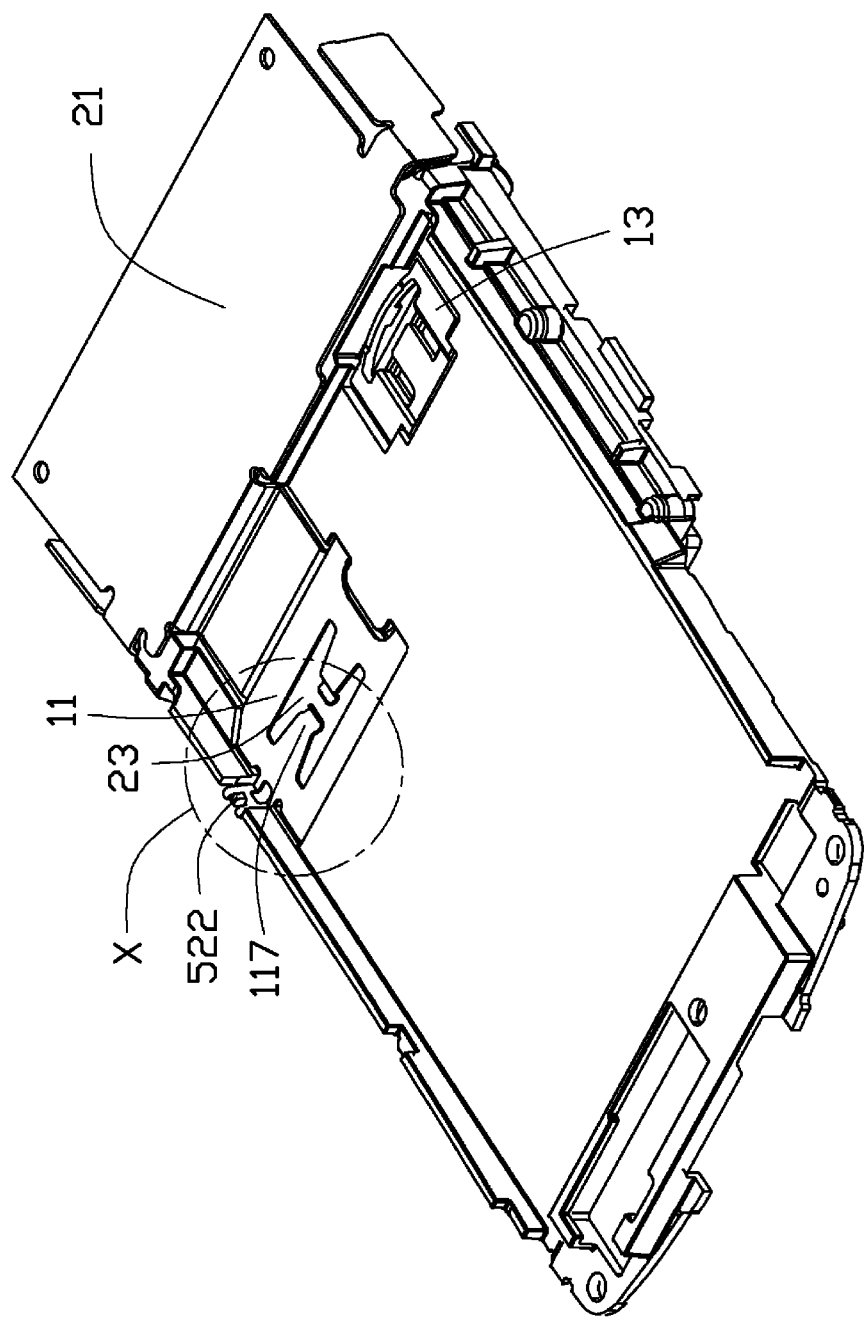
FIG. 6 is a partially assembled view of FIG. 1.
Figure 7:
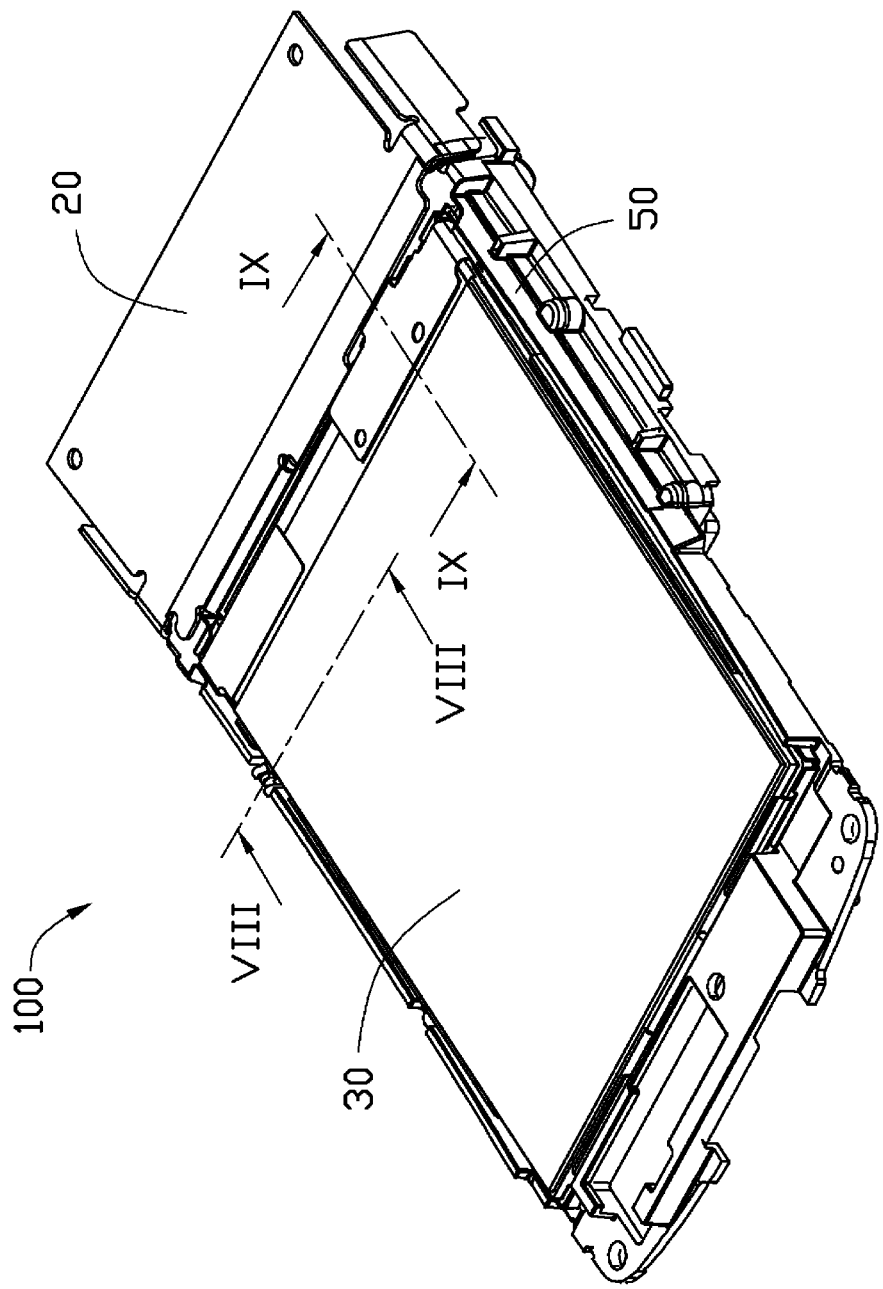
FIG. 7 is an assembled view of FIG. 1.
Figure 8:
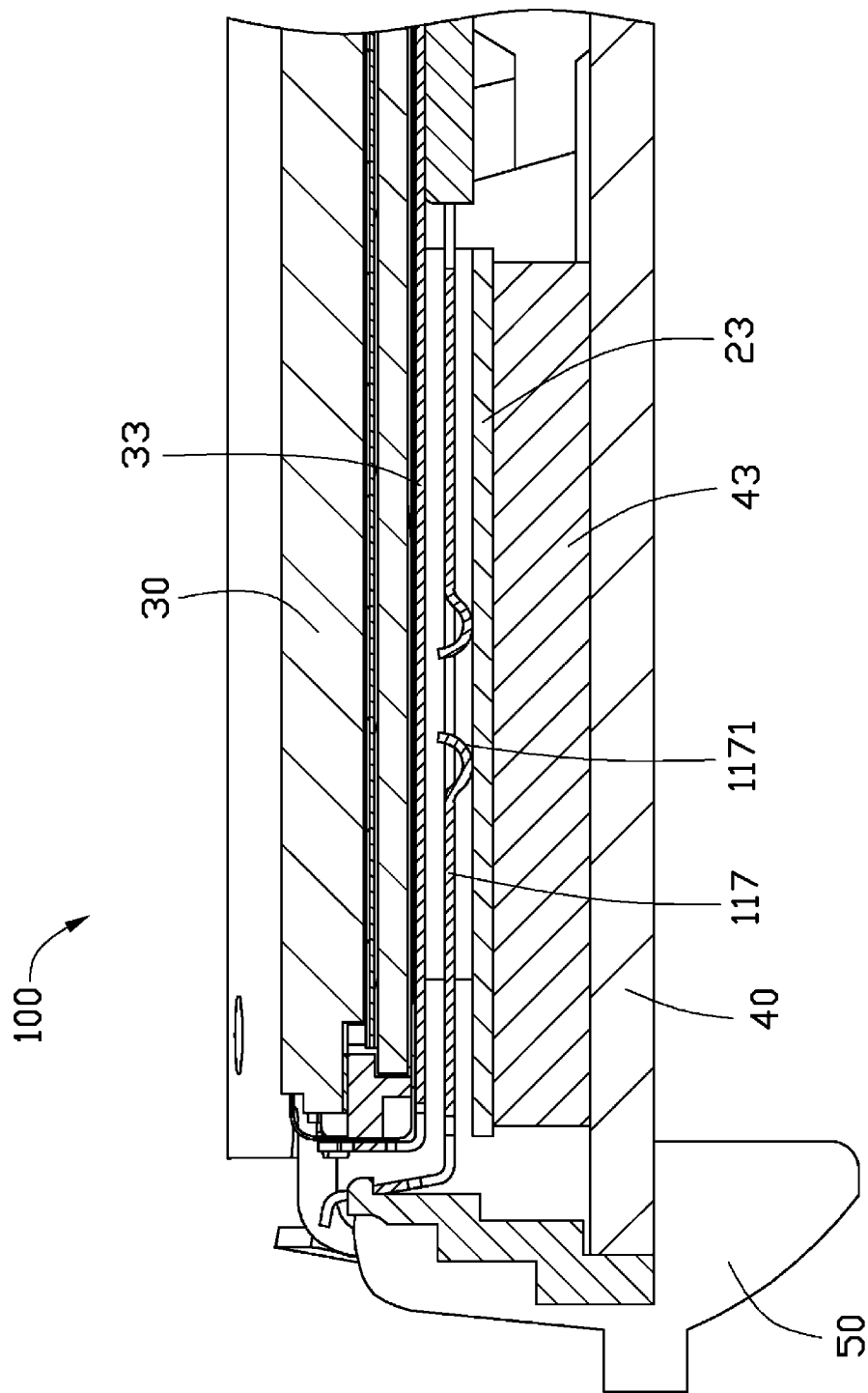
FIG. 8 is a cross-sectional view of FIG. 7 along line VIII-VIII.
Figure 9:
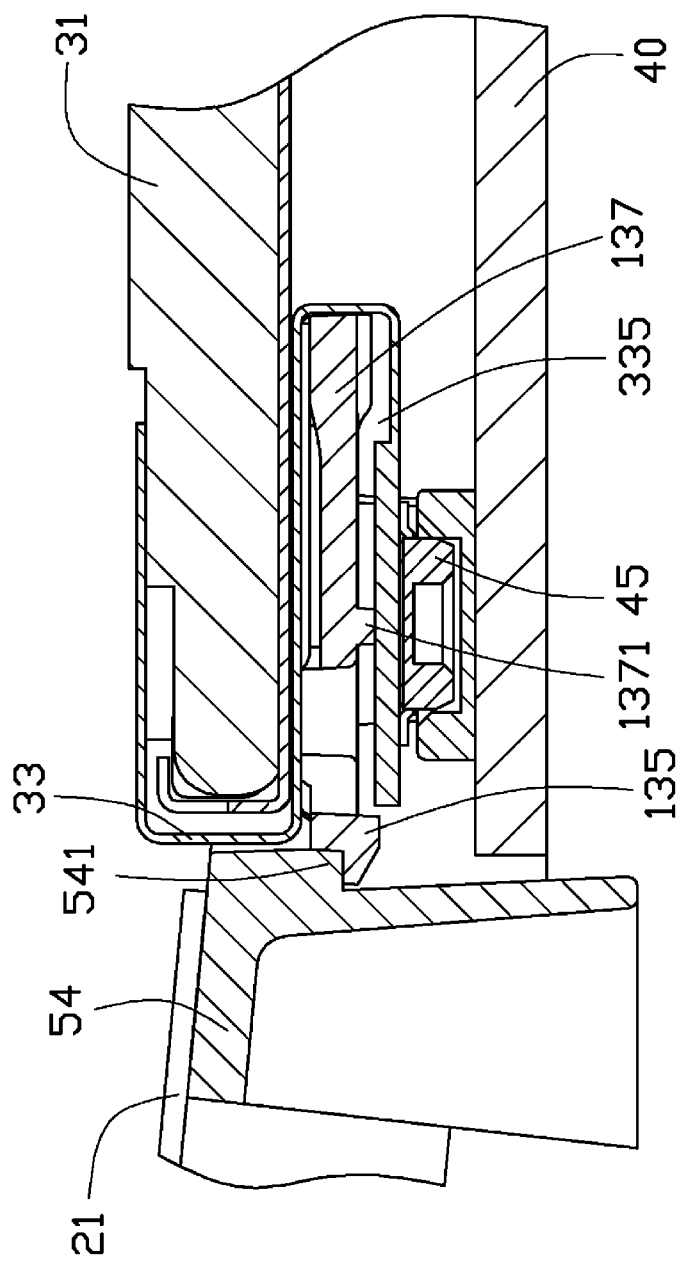
FIG. 9 is a cross-sectional view of FIG. 7 along line IX-IX.
Figure 10:
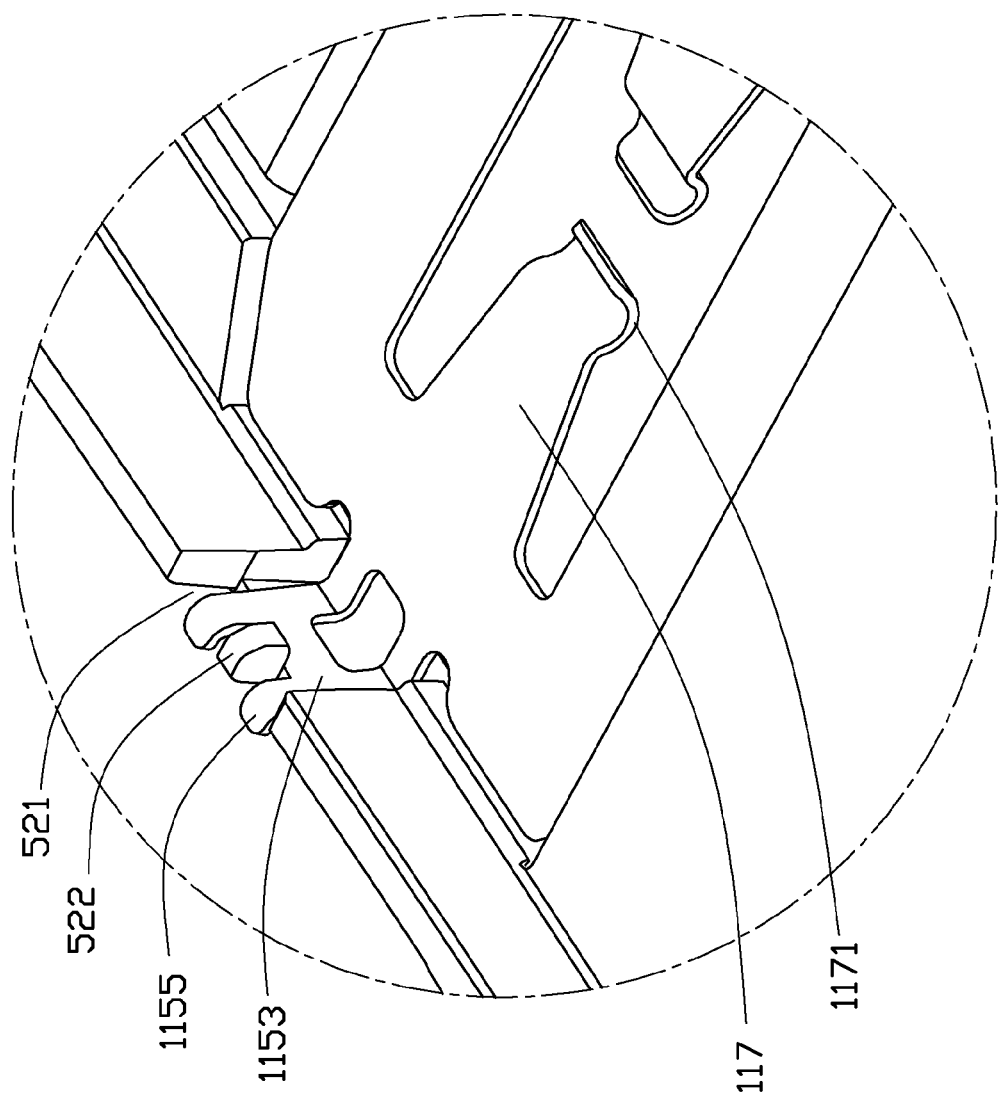
FIG. 10 is an enlarged view of circled portion X of FIG. 6.

Referring to FIGS. 4 and 5, the second clip 13 includes a main base 131. The main base 131 defines an aperture 1311. A block 135 is formed at one end of the main base 131 adjacent to the aperture 1311. A cantilevered portion 137 extends from another end of the main base 131 into the aperture 1311. A projection 1371 is formed on a distal end of the cantilevered portion 137. Two recessed portions 133 are formed at two corners of the main base 131. A protrusion 1319 is formed at one side of the main base 131.

The first FPCB 20 includes a first section 21 and a second section 23. The first section 21 is configured to fix the first FPCB 20 to the housing 50. The second section 23 corresponds to the first clip 11, and is electrically connected to the PCB 40.

The LCD module 30 includes a display 31 and a second FPCB 33. The second FPCB 33 is fixed to the display 31, and is configured to electronically connect to the PCB 40. One portion of the second FPCB 33 surrounds the display 31, and another portion is bent to define a cavity 335 for receiving the second clip 13.

The PCB 40 includes a first connecter 43 and a second connector 45. The first connector 43 is electrically connected to the second section 23 of the first FPCB 20. The second connector 45 is electrically connected to the second FPCB 33.

The housing 50 includes a base wall 51, a first sidewall 52, a second sidewall 53, and an end wall 54. The first sidewall 52 is opposite to the second sidewall 53. The end wall 54 is connected with ends of the first sidewall 52 and the second sidewall 53. The first sidewall 52 defines a notch 521 and forms a hook 522 for latching with the first clip 11. The base wall 51 defines a first hole 511 and a second hole 512 adjacent to the end wall 54. Two slots 5111 are defined at one side of the first hole 511 of the base wall 51 opposite to the first sidewall 52. A stopper wall 541 is formed at one end of the second hole 512, and two stepped portions 5122 are formed at the other end of the second hole 512.

During assembly, referring to FIG. 6 to FIG. 10, the PCB 40 is assembled to one side of the housing 50, and the first FPCB 20 is latched to the other side of the housing 50. The first connector 43 extends into the first hole 511, the second section 23 is aligned with the first hole 511. Then, the first clip 11 is attached to the base wall 51 of the housing 50. The two tabs 113 are inserted into the slots 5111. The legs 1151 of the latching portion 115 are received in the notch 521, and the beam 1153 is latched to the hook 522 of the first sidewall 52. Thus, the first clip 11 is fixed to the housing 50. The two arcuate portions 1171 resist the FPCB 20 to tightly connect the FPCB 20 to the PCB 40. After that, the second clip 13 is inserted into the cavity 333 of the second FPCB 33. The LCD 30 with the second clip 13 is attached to the housing 50. The second FPCB 33 is aligned with the second hole 512. The second connector 45 is exposed from the second hole 512. The resisting portions 133 engage with the recessed portions 5122. The block 135 is engaged with the stopper wall 541. Thus, the second clip 13 is fixed to the housing 50. The projection 1371 presses the second FPCB 33 against the PCB 40. Assembly of the mobile phone 100 is thus completed. The first clip 11 and the second clip 13 provide a stable electrical connection with the PCB 40.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A portable electronic device comprising:
a housing including a base wall and a sidewall, the sidewall defining a notch and forming a hook;
a printed circuit board attached to one side of the housing;
a first flexible printed circuit board attached to another side of the housing;
a first clip elastically pressing the first flexible printed circuit board against the printed circuit board, the first clip including a latching portion, the latching portion including two legs parallel to each other and a beam connected between the legs, the legs received in the notch and the beam latched to the hook to fix the first clip to the housing;
a liquid crystal display module attached to the housing, and including a second flexible printed circuit board; and
a second clip attached to the second flexible printed circuit board and latching to the housing, the second clip elastically pressing the second flexible printed circuit board against the printed circuit board.

2. The portable electronic device as claimed in claim 1, wherein the first clip includes a main section, two tabs extend from one end of the main section, and the latching portion extends from a middle area at another end of the main section.

3. The portable electronic device as claimed in claim 2, wherein a foot is formed at each end of the legs.

4. The portable electronic device as claimed in claim 2, wherein the main section defines an opening, and forms two opposite tongue portions extending into the opening, an arcuate portion is formed at a distal end of each tongue portion, the arcuate portions press the first flexible printed circuit board against the printed circuit board.

5. The portable electronic device as claimed in claim 1, wherein the second clip includes a main base, the main base includes an aperture and a cantilevered portion extending into the aperture, a projection is formed on a distal end of the cantilevered portion for abutting against the second flexible printed circuit board, a block is formed at one end of the main base, the housing includes a stopper wall, the block is engaged with the stopper wall for latching the second clip to the housing.

6. The portable electronic device as claimed in claim 5, wherein the base wall defines a first hole and a second hole, the stopper wall is formed at one end of the second hole, and two stepped portions are formed at the other end of the second hole, the second clip includes two recessed portions formed at two corners of the main base, the recessed portions engage with stepped portion.

7. The portable electronic device as claimed in claim 6, wherein the printed circuit board includes a first connecter and a second connector, the first connector extends into the first hole for electronically connecting with the first flexible printed circuit board, the second connector is exposed from the second hole for electronically connecting with the second flexible printed circuit board.

* * * * *